United States Patent
Kim et al.

(10) Patent No.: US 11,455,053 B2
(45) Date of Patent: Sep. 27, 2022

(54) DISPLAY DEVICE WITH INPUT SENSOR HAVING ALIGNMENT MEMBER CONNECTED TO GROUND

(71) Applicant: Samsung Display Co., Ltd., Yongin-si (KR)

(72) Inventors: Jong-Hwa Kim, Yongin-si (KR); Hwan-Hee Jeong, Cheonan-si (KR); Kyungsu Lee, Suwon-si (KR); Jeongyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/063,535

(22) Filed: Oct. 5, 2020

(65) Prior Publication Data

US 2021/0181889 A1    Jun. 17, 2021

(30) Foreign Application Priority Data

Dec. 13, 2019  (KR) .................. 10-2019-0167203

(51) Int. Cl.
| | |
|---|---|
| *G06F 3/041* | (2006.01) |
| *G06F 3/044* | (2006.01) |
| *H01R 12/71* | (2011.01) |
| *H01L 23/544* | (2006.01) |
| *G09G 3/00* | (2006.01) |

(52) U.S. Cl.
CPC .......... *G06F 3/0416* (2013.01); *G06F 3/0446* (2019.05); *G06F 2203/04111* (2013.01); *G09G 3/006* (2013.01); *H01L 23/544* (2013.01); *H01R 12/714* (2013.01)

(58) Field of Classification Search
CPC ............ G06G 3/0416; G06G 3/04164; G06G 3/0446; G09G 3/006; H01L 23/544; H01R 12/712; G06F 3/0416; G06F 3/04164; G06F 3/0446
See application file for complete search history.

(56) References Cited

U.S. PATENT DOCUMENTS

| | | | |
|---|---|---|---|
| 9,111,706 B2 * | 8/2015 | Chen | ................ H05K 1/0269 |
| 10,146,377 B2 | 12/2018 | Park et al. | |
| 10,159,135 B2 | 12/2018 | Ikeda et al. | |
| 10,175,813 B2 | 1/2019 | Maruyama et al. | |

(Continued)

FOREIGN PATENT DOCUMENTS

| | | |
|---|---|---|
| CN | 105607769 | 5/2016 |
| KR | 10-2016-0072909 | 6/2016 |
| KR | 10-2017-0040205 | 4/2017 |

*Primary Examiner* — Liliana Cerullo
(74) *Attorney, Agent, or Firm* — H.C. Park & Associates, PLC

(57) ABSTRACT

A display device includes a display panel and an input sensor disposed on the display panel and having an active area and a peripheral area adjacent to the active area. The input sensor includes a sensing electrode disposed in the active area; a sensing line disposed in the peripheral area and electrically connected to the sensing electrode; a sensing pad disposed in the peripheral area and electrically connected to the sensing line; a ground pad disposed in the peripheral area and to receive a ground voltage; and a first alignment member disposed in the peripheral area and electrically connected to the ground pad.

15 Claims, 9 Drawing Sheets

(56) References Cited

U.S. PATENT DOCUMENTS

| | | | |
|---|---|---|---|
| 2009/0107736 A1* | 4/2009 | Ben-Eliyahu | G06F 3/0446 178/18.01 |
| 2011/0157084 A1* | 6/2011 | Huang | G06F 3/0446 345/174 |
| 2014/0117998 A1* | 5/2014 | Hwang | G09G 3/006 324/511 |
| 2015/0109247 A1* | 4/2015 | Chen | G06F 3/0443 345/174 |
| 2019/0116672 A1* | 4/2019 | Zhao | G01R 31/2818 |
| 2020/0196452 A1* | 6/2020 | Lee | H05K 1/189 |

* cited by examiner

DISPLAY DEVICE WITH INPUT SENSOR HAVING ALIGNMENT MEMBER CONNECTED TO GROUND

CROSS REFERENCE TO RELATED APPLICATION

This application claims priority from and the benefit of Korean Patent Application No. 10-2019-0167203, filed on Dec. 13, 2019, which is hereby incorporated by reference for all purposes as if fully set forth herein.

BACKGROUND

Field

Exemplary implementations of the invention relate generally to a display device, and more specifically, a display device having an input sensor.

Discussion of the Background

A display device displays an image or senses an external input in response to electrical signals applied thereto. The display device includes a display panel for displaying the image and an input sensor for sensing the external input. The input sensor may include sensing electrodes, sensing lines, and sensing pads. The sensing lines transmit and/or receive signals.

The above information disclosed in this Background section is only for understanding of the background of the inventive concepts, and, therefore, it may contain information that does not constitute prior art.

SUMMARY

Applicant discovered that an input sensor of a display device may be unreliable due to electric charges that can accumulate in an alignment pattern or a test pad of the input sensor.

Display devices with an input sensor constructed according to the principles and exemplary implementations of the invention provide improved reliability. For example, an alignment part or a test pad of the input sensor is electrically connected to a ground pad to discharge electric charges accumulated in the alignment pattern or the test pad. Thus, the input sensor of the display device may be prevented from being damaged due to the accumulated electric charges and the reliability of the display device improved.

Additional features of the inventive concepts will be set forth in the description which follows, and in part will be apparent from the description, or may be learned by practice of the inventive concepts.

According to one aspect of the invention, a display device includes a display panel; and an input sensor disposed on the display panel and having an active area and a peripheral area adjacent to the active area, the input sensor including: a sensing electrode disposed in the active area; a sensing line disposed in the peripheral area and electrically connected to the sensing electrode; a sensing pad disposed in the peripheral area and electrically connected to the sensing line; a ground pad disposed in the peripheral area and to receive a ground voltage; and a first alignment member disposed in the peripheral area and electrically connected to the ground pad.

The input sensor may include a test pad disposed in the peripheral area and spaced apart from the sensing pad.

The test pad may be disposed between the ground pad and the sensing pad.

The test pad may include a plurality of test pads, and the input sensor further includes a test line connected to the plurality of test pads.

The test pad may be electrically connected to the ground pad through a connector.

The input sensor may further include a ground line disposed in the peripheral area and electrically connected to the ground pad.

The ground line may surround the active area.

The first alignment member may include an alignment key integrated with the ground pad.

The first alignment member may be a first alignment key comprising: a extension portion extending in a first direction; and a protrusion portion protruding from the extension portion in a second direction intersecting the first direction.

The extension portion may be connected to the ground pad.

The extension portion may extend in a direction away from the sensing pad.

The display panel may include a display pad disposed at a lower end of the display panel when viewed in plan, the sensing pad is disposed at an upper end of the input sensor when viewed in plan.

The display device may further include: a circuit film disposed on the input sensor; and a conductive adhesive member disposed between the circuit film and the input sensor.

The circuit film may include: a base film; film sensing pad disposed on the base film and overlapping the sensing pad; and a second alignment member disposed on the base film and aligned with the first alignment member.

The first alignment member includes substantially the same material as the ground pad.

According to another aspect of the invention, an input sensor includes a base layer, a sensing electrode disposed on the base layer, a sensing line electrically connected to the sensing electrode, a sensing pad electrically connected to the sensing line, an alignment pad spaced apart from the sensing pad and receiving a ground voltage, and a ground line electrically connected to the alignment pad. The alignment pad includes a pad portion connected to the ground line, an extension portion extending from the pad portion in a first direction, and a protrusion portion protruding from the extension portion in a second direction crossing the first direction.

The input sensor further includes a test pad disposed between the sensing pad and the alignment pad.

The input sensor may further include a test line, wherein the test pad includes a plurality of test pads, and the test line is connected to the plurality of test pads.

The test pad may be electrically connected to the alignment pad.

The ground line may surround the sensing line when viewed in plan.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
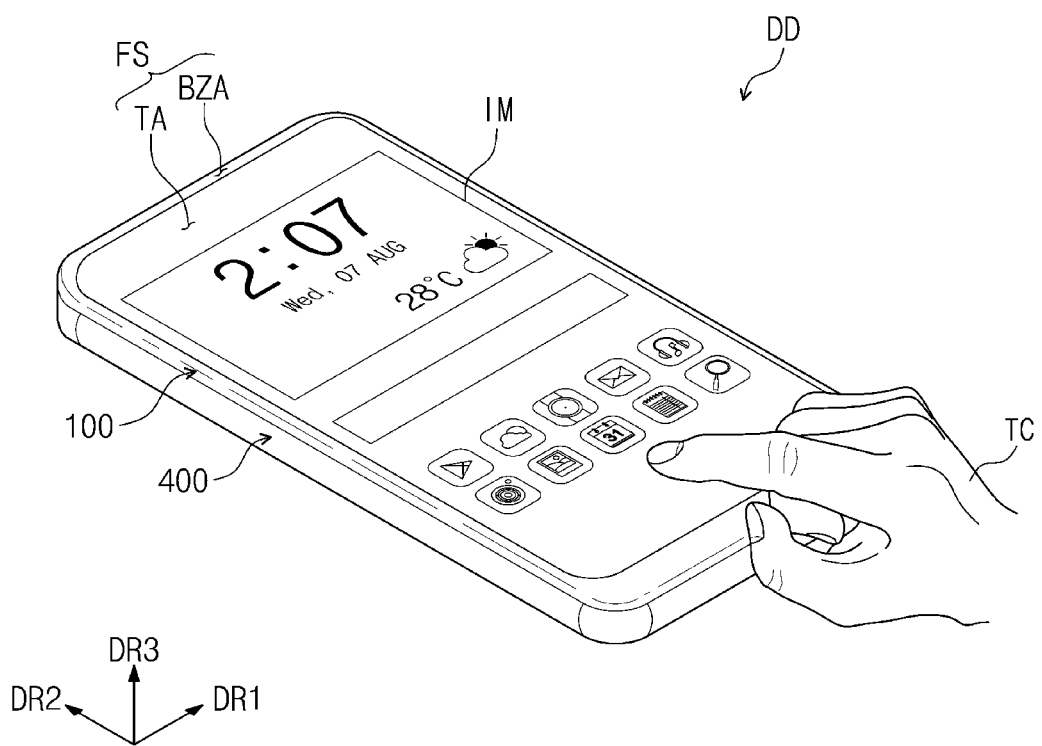
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
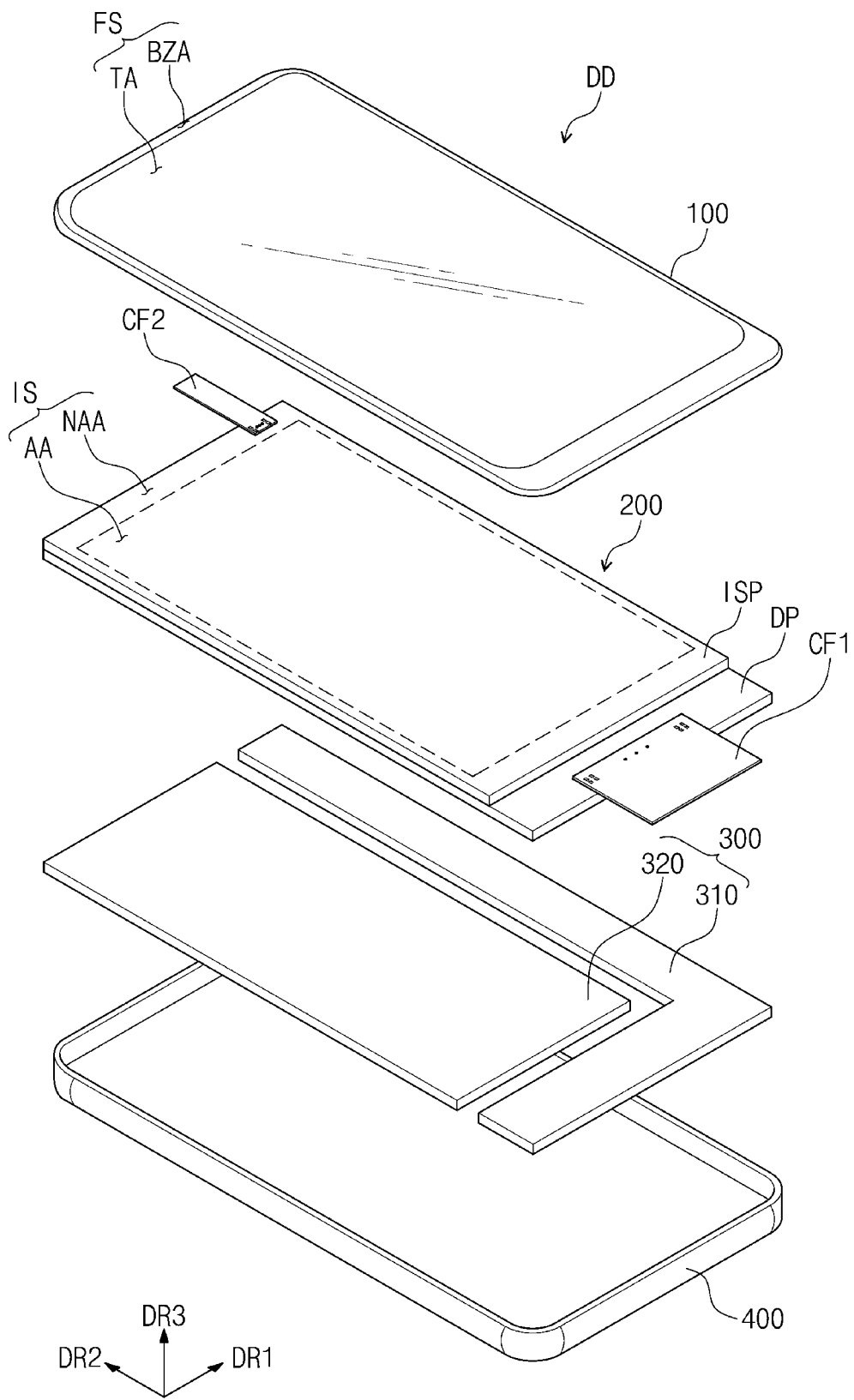
FIG. 2 is an exploded perspective view of the display device of FIG. 1.

FIG. 1 is a perspective view of an exemplary embodiment of a display device DD constructed according to the principles of the invention, and FIG. 2 is an exploded perspective view of the display device DD of FIG. 1.

Referring to FIGS. 1 and 2, the display device DD may be a device activated in response to an electrical signal. The display device DD may include various exemplary embodiments. For example, the display device DD may include a tablet computer, a notebook computer, a computer, or a smart television. In the illustrated exemplary embodiment, a smartphone will be described as an example of the display device DD for descriptive convenience.

The display device DD may display an image IM through a front surface FS, which is substantially parallel to a face defined by a first direction DR1 and a second direction DR2. The front surface FS may include a transmission area TA and a bezel area BZA adjacent to the transmission area TA.

The display device DD may display the image IM through the transmission area TA. The image IM may include at least one of a still image and a motion image. As shown in FIG. 1, shows a clock widget and application icons as examples of the image IM.

The transmission area TA may have a generally quadrangular shape substantially parallel to each of the first direction DR1 and the second direction DR2, but exemplary embodiments are not limited thereto. For example, the transmission area TA may have a variety of shapes.

The bezel area BZA may have one or more predetermined colors. The bezel area BZA may have a relatively lower light transmittance than the transmission area TA. The bezel area BZA may be defined adjacent to the transmission area TA. The bezel area BZA may define the shape of the transmission area TA. The bezel area BZA may surround the transmission area TA, but exemplary embodiments are not limited thereto. For example, the bezel area BZA may be disposed adjacent to only one side of the transmission area TA or may be omitted. Further, the display device DD may include various types of display devices, exemplary embodiments are not limited to a particular type or design.

A normal line direction of the front surface FS may correspond to a thickness direction DR3 (hereinafter, referred to as a "third direction") of the display device DD. In the illustrated exemplary embodiments, front (or upper) and rear (or lower) surfaces of each member of the display device DD may be defined according to a direction in which the image IM is displayed. The front and rear surfaces face each other in the third direction DR3, and a normal line direction of each of the front and rear surfaces is substantially parallel to the third direction DR3. The third direction DR3 may cross the first direction DR1 and the second direction DR2. The first, second, and third directions DR1, DR2, and DR3 may be substantially perpendicular to each other.

In addition, in the following descriptions, the face defined by the first direction DR1 and the second direction DR2 may be defined as a plane, and the expression "when viewed in plan" means a state of being viewed in the third direction DR3.

The display device DD may sense an external input TC applied thereto from the outside. The external input TC may include external inputs of various forms, such as a part of the user's body, light, heat, or pressure. In addition, the display device DD may sense other external inputs, e.g., a proximity input applied when an object such as a stylus is approaching close to or adjacent to the display device DD as well as a touch input.

The display device DD may include a window 100, a display module 200, a control module 300, and an external case 400. The window 100 and the external case 400 are coupled to each other to form an exterior of the display device DD.

The window 100 may be disposed on the display module 200 and may cover a front surface IS of the display module 200. The window 100 may include an optically transparent insulating material. For example, the window 100 may include a glass substrate, a sapphire substrate, or a plastic substrate. The window 100 may have a single-layer or multi-layer structure. In an exemplary embodiment, the window 100 may have a stacking structure of a plurality of plastic films attached to each other by an adhesive or a stacking structure of a glass substrate and a plastic film attached to the glass substrate by an adhesive.

The window 100 may include a front surface FS exposed to the outside. The front surface FS of the display device DD may be defined by the front surface FS of the window 100.

The display module 200 may be disposed under the window 100. The display module 200 may display the image IM and may sense the external input TC. The display module 200 may include the front surface IS including an active area AA and a peripheral area NAA. The active area AA may be an area activated by an electrical signal.

In the illustrated exemplary embodiment, the active area AA may be an area through which the image IM is displayed and substantially simultaneously the external input is sensed. The transmission area TA may overlap the active area AA when viewed in plan. For example, the transmission area TA may overlap substantially the entire surface or at least a portion of the active area AA. Accordingly, a user views the image IM or provides the external input TC through the transmission area TA, but exemplary embodiments are not limited thereto. For example, an area through which the image IM is displayed and an area through which the external input TC is sensed may be separated from each other in the active area AA, but exemplary embodiments are not limited thereto.

The peripheral area NAA may be covered by the bezel area BZA. The display module 200 may be assembled in a flat state such that the peripheral area NAA faces the window 100, but exemplary embodiments are not limited thereto. A portion of the peripheral area NAA may be bent. In this case, the portion of the peripheral area NAA may be bent toward a rear surface of the display module 200, and thus, the bezel area BZA may be reduced in the front surface FS of the display device DD. In another exemplary embodiment, the display module 200 may have a partially-bent shape in the active area AA, but exemplary embodiments are not limited thereto. The peripheral area NAA may be omitted according to another exemplary embodiment.

The display module 200 may include a display panel DP, an input sensor such as an input sensor ISP, a first circuit film CF1, and a second circuit film CF2.

The display panel DP may include configurations appropriate to generate the image IM. The image IM generated by the display panel DP may be displayed in the front surface IS through the transmission area TA and may be viewed from the outside by a user. According to an exemplary embodiment, the display panel DP may be a light-emitting type display panel, but exemplary embodiments are not limited thereto. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod.

The input sensor ISP may be disposed on the display panel DP. The input sensor ISP may sense the external input TC applied thereto from the outside.

The first circuit film CF1 may be electrically connected to the display panel DP. The first circuit film CF1 may connect the display panel DP and a controller 310. In the illustrated exemplary embodiment, the first circuit film CF1 is implemented by a flexible circuit film. However, exemplary embodiments are not limited thereto. For example, the first circuit film CF1 may not be connected to the controller 310.

The first circuit film CF1 may include a circuit chip. The circuit chip may be mounted on the first circuit film CF1 in a chip-on-film (COF) manner. The circuit chip may transmit an electrical signal to the display panel DP. For example, the circuit chip may generate the electrical signal for operating the display panel DP based on a control signal provided from the controller 310, but exemplary embodiments are not limited thereto. The circuit chip according to an exemplary embodiment may be omitted.

The second circuit film CF2 may be electrically connected to the input sensor ISP. The second circuit film CF2 may connect the input sensor ISP and the controller 310. In the illustrated exemplary embodiment, the second circuit film CF2 is implemented by a flexible circuit film.

The first circuit film CF1 may be disposed at a lower end of the display module 200 when viewed in plan. The second circuit film CF2 may be disposed at an upper end of the display module 200 when viewed in plan. Thus, the peripheral area NAA of the lower end of the display module 200 may be reduced.

The control module 300 may be disposed under the display module 200. The control module 300 may include the controller 310 and a power supply 320.

The controller 310 may supply the electrical signal to the display module 200. The controller 310 may include various functional modules configured to operate the display module 200 and a connector configured to supply a power. The functional modules may include a wireless communication module, an image input module, a sound input module, a memory, an external interface, a light emitting module, a light receiving module, and a camera module. The functional modules may be mounted on a mother board. The mother board may include a printed circuit board that is rigid. Some of the functional modules may be electrically connected to the mother board through a flexible circuit film without being mounted on the mother board.

Each of the first circuit film CF1 and the second circuit film CF2 may be connected to the controller 310, but exemplary embodiments are not limited thereto. In the display module 200 according to an exemplary embodiment, the display panel DP and the input sensor ISP may be connected to different controllers from each other, one of the first circuit film CF1 and the second circuit film CF2 may not be connected to the controller 310, but exemplary embodiments are not limited thereto.

The power supply 320 may supply the power for overall operation of the display device DD. The power supply 320 may include a conventional battery module.

The external case 400 may be disposed under the control module 300. The external case 400 may form the exterior of the display device DD with the window 100. The external case 400 may include a material having a relatively high rigidity compared with the display module 200.

Referring to FIG. 2, the external case 400 formed in a single body is shown as an example, but exemplary embodiments are not limited thereto. According to other exemplary embodiments, the external case 400 may include a plurality of bodies assembled with each other. For example, the external case 400 may include a plurality of frames and/or plates formed of a glass, plastic, or metal material. The external case 400 may provide a predetermined accommodating space. The display module 200 and the control module 300 may be accommodated in the accommodating space and may be protected from external impacts.

Figure 3:
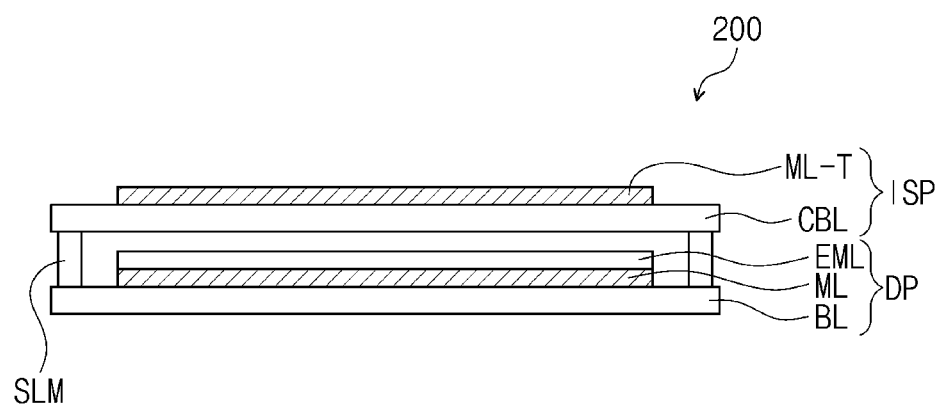
FIG. 3 is a cross-sectional view of an exemplary embodiment of the display module of FIG. 2.
Figure 3:
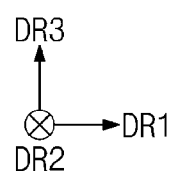

FIG. 3 is a cross-sectional view of the display module 200 of FIG. 2. Referring to FIG. 3, the display module 200 may include a display panel DP, an input sensor ISP, and a coupling member SLM.

The display panel DP may include a first base layer BL, a display circuit layer ML, and a display element layer EML. The first base layer BL may be a silicon substrate, a plastic substrate, a glass substrate, an insulating film, or a stack structure including a plurality of insulating layers. The display circuit layer ML may be disposed on the first base layer BL. The display circuit layer ML may include a plurality of insulating layers, a plurality of conductive layers, and a semiconductor layer. The conductive layers may form signal lines or a pixel control circuit. The display element layer EML may be disposed on the display circuit layer ML. The display element layer EML may generate a light or may control a light transmittance. For example, the display element layer EML of the organic light emitting display panel may include the organic light emitting material. The display element layer EML of the quantum dot light emitting display panel may include at least one of the quantum dot and the quantum rod. The display element layer EML of a liquid crystal display panel may include a liquid crystal layer.

The input sensor ISP may include a second base layer CBL and a sensing circuit layer ML-T. The second base layer CBL may be disposed on the display element layer EML. The second base layer CBL may be a silicon substrate, a plastic substrate, a glass substrate, an insulating film, or a stack structure including a plurality of insulating layers. A predetermined space is defined between the second base layer CBL and the display element layer EML. The space may be filled with air or an inert gas. In addition, in an exemplary embodiment, the space may be filled with a filler such as a silicone-based polymer, an epoxy-based resin, or an acrylic-based resin. The sensing circuit layer ML-T may be disposed on the second base layer CBL. The sensing circuit layer ML-T may include a plurality of insulating layers and a plurality of conductive layers. The conductive layers may include a sensing electrode that senses the external input, a sensing line that is connected to the sensing electrode, and a sensing pad that is connected to the sensing line.

The coupling member SLM may be disposed between the first base layer BL and the second base layer CBL. The coupling member SLM may couple the first base layer BL and the second base layer CBL. The coupling member SLM may include an organic material, such as a photo-curable resin or a photo-plastic resin, or may include an inorganic material, such as a frit seal, however, it should not be particularly limited.

Figure 4:
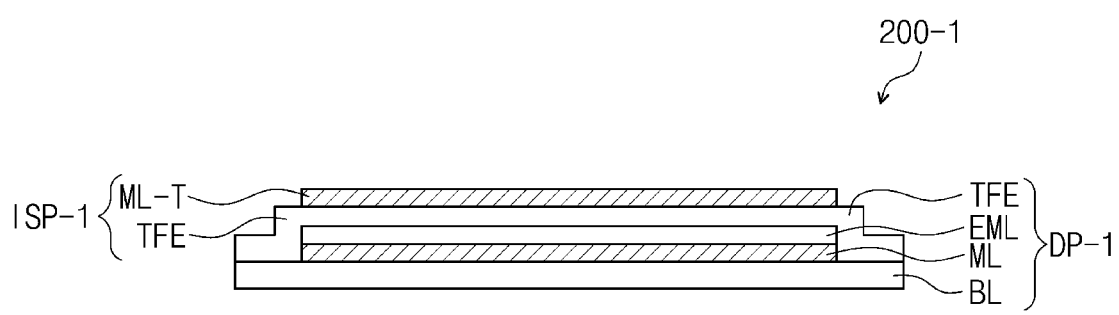
FIG. 4 is a cross-sectional view of another exemplary embodiment of the display module of FIG. 2.
Figure 4:
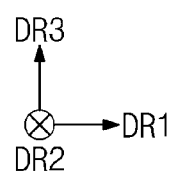

FIG. 4 is a cross-sectional view of another exemplary embodiment of a display module 200-1 of FIG. 2. In FIG. 4, the same reference numerals denote the same elements in FIG. 3 for descriptive convenience, and thus, detailed descriptions of the same elements will be omitted to avoid redundancy.

Referring to FIG. 4, the display module 200-1 may include a display panel DP-1 and an input sensor ISP-1. The display panel DP-1 may include a first base layer BL, a display circuit layer ML, a display element layer EML, and a thin film encapsulation layer TFE. The input sensor ISP-1 may include the thin film encapsulation layer TFE and a sensing circuit layer ML-T. The thin film encapsulation layer TFE of FIG. 4 and the second base layer CBL of FIG. 3 may be substantially the same element.

According to an exemplary embodiment, the display panel DP-1 and the input sensor ISP-1 may be formed through successive processes. For example, the sensing circuit layer ML-T may be formed directly on the thin film encapsulation layer TFE. In another exemplary embodiment, the sensing circuit layer ML-T may be formed directly on the first base layer BL.

Figure 5:
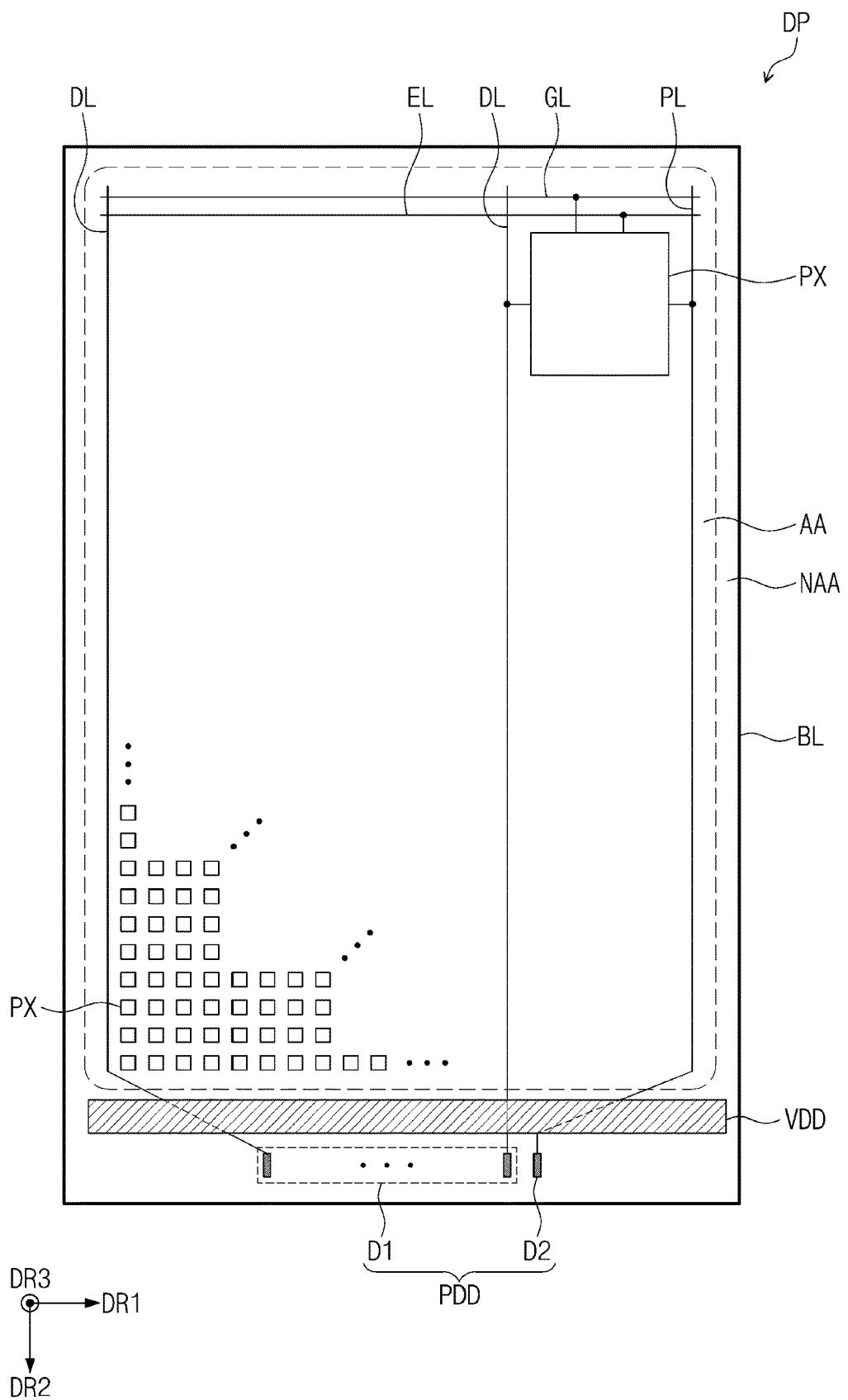
FIG. 5 is a plan view of the display panel of FIG. 2.

FIG. 5 is a plan view of the display panel DP of FIG. 2.

Referring to FIG. 5, the display panel DP may include the base layer BL, a plurality of pixels PX, a plurality of signal lines GL, DL, PL, and EL, and a plurality of display pads PDD. The signal lines GL, DL, PL, and EL and the display pads PDD may form the display circuit layer ML of FIG. 3.

The active area AA of the display panel DP may be the area through which the image IM of FIG. 1 is displayed. The pixels PX may be arranged in the active area AA. The peripheral area NAA may be the area in which a driving circuit or a driving line is disposed.

The signal lines GL, DL, PL, and EL may be connected to the pixels PX to transmit electrical signals to the pixels PX. Referring to FIG. 5, a scan line GL, a data line DL, a power line PL, and a light emitting control line EL among the signal lines included in the display panel DP are shown as an example, but exemplary embodiments are not limited thereto. For example, the signal lines GL, DL, PL, and EL may further include an initialization voltage line.

A power pattern VDD may be disposed in the peripheral area NAA. The power pattern VDD may be connected to a plurality of power lines PL. Accordingly, as the display panel DP includes the power pattern VDD, the pixels may receive a first power supply signal that is substantially constant.

The display pads PDD may be disposed at the lower end of the display panel DP when viewed in plan. The display pads PDD may include a first pad D1 and a second pad D2. The first pad D1 may be provided in plural, and the first pads D1 may be respectively connected to the data lines DL. The second pad D2 may be connected to the power pattern VDD to be electrically connected to the power line PL. The display panel DP may supply the electrical signals, which are provided from the outside through the display pads PDD, to the pixels PX. The display pads PDD may further include pads to receive other electrical signals in addition to the first and second pads D1 and D2, but exemplary embodiments are not limited thereto.

Figure 6:
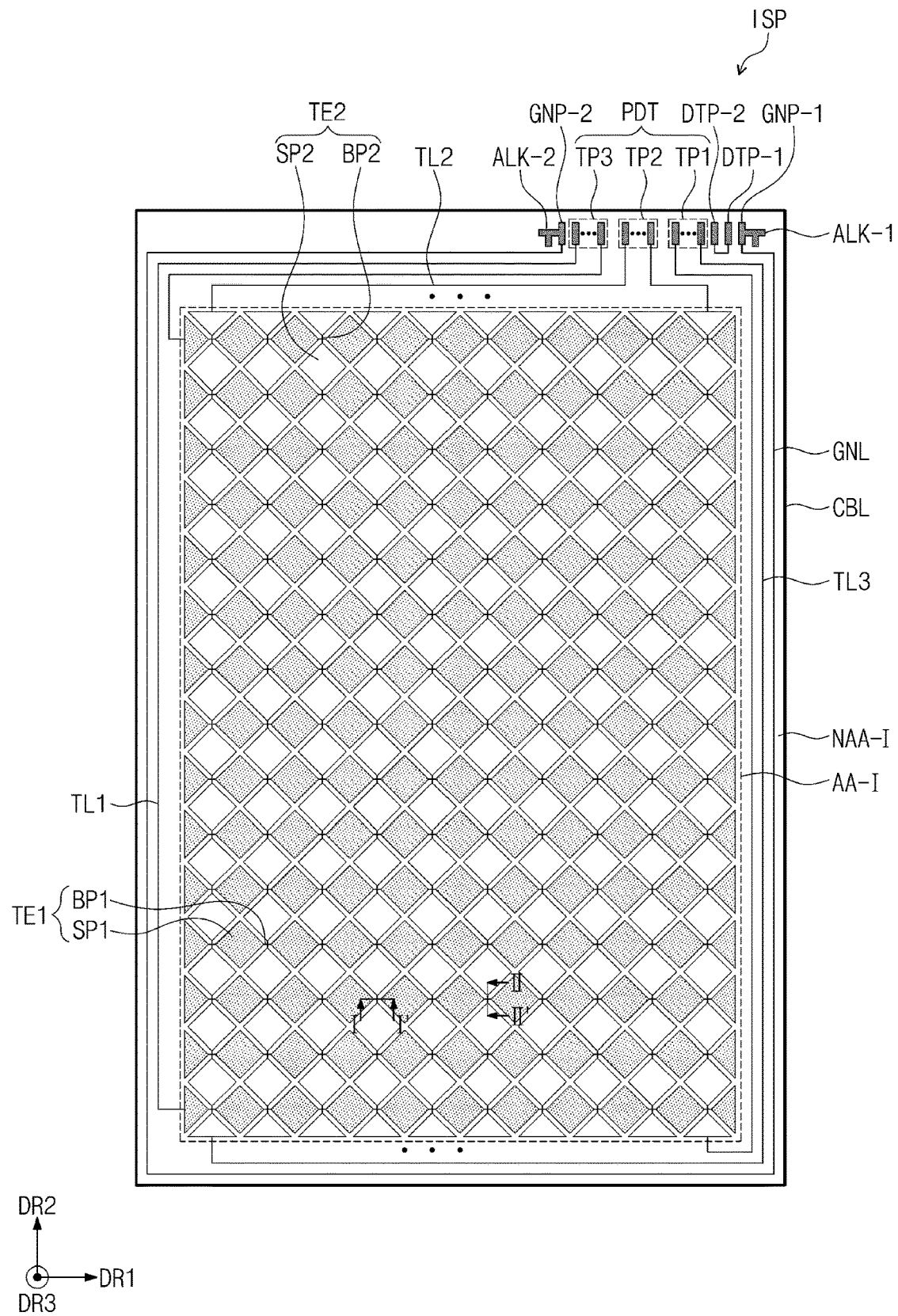
FIG. 6 is a plan view of the input sensor of FIG. 2.
Figure 7A:
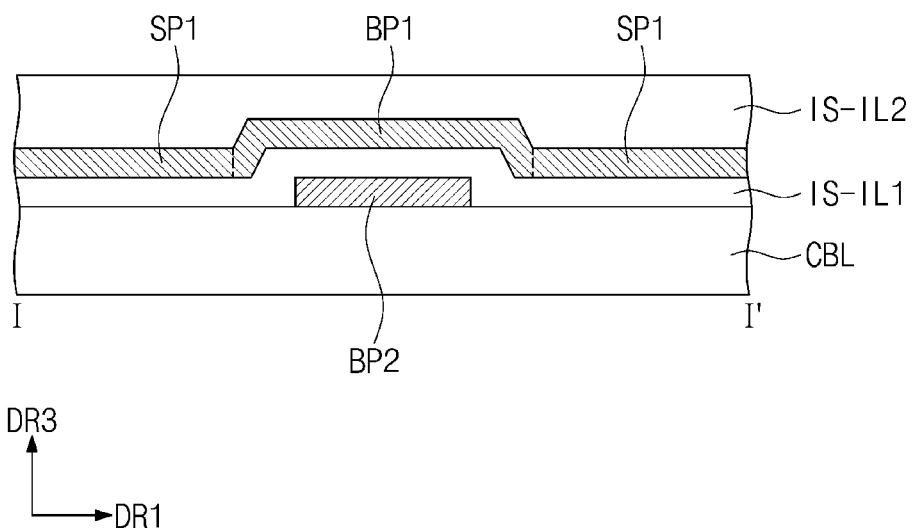
FIG. 7A is a cross-sectional view of the input sensor taken along a line I-I' of FIG. 6.
Figure 7B:
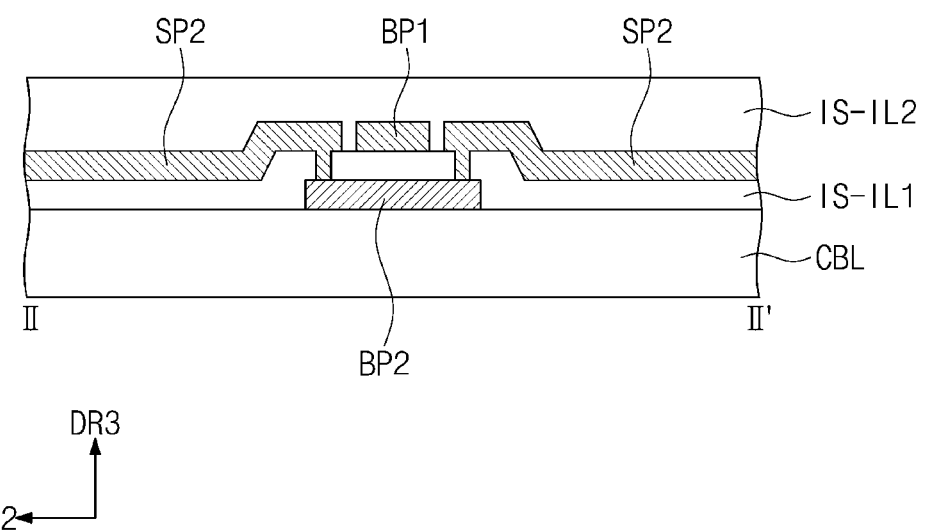
FIG. 7B is a cross-sectional view of the input sensor taken along a line II-IF of FIG. 6.

FIG. 6 is a plan view of the input sensor ISP of FIG. 2, FIG. 7A is a cross-sectional view of the input sensor ISP taken along a line I-I' of FIG. 6, and FIG. 7B is a cross-sectional view the input sensor ISP taken along a line II-IF of FIG. 6.

Referring to FIGS. 6, 7A, and 7B, the input sensor ISP may include an active area AA-I and a peripheral area NAA-I defined adjacent to the active area AA-I, which are defined therein. The peripheral area NAA-I may surround the active area AA-I. The active area AA-I may correspond to the active area AA of FIG. 5. The peripheral area NAA-I may correspond to the peripheral area NAA of FIG. 5.

The input sensor ISP may include the second base layer CBL, a plurality of sensing electrodes TE1 and TE2, a plurality of sensing lines TL1, TL2, and TL3, a plurality of sensing pads PDT, a ground line GNL, a plurality of ground pads GNP-1 and GNP-2, a plurality of first alignment members such as alignment keys ALK-1 and ALK-2, and a plurality of test pads DTP-1 and DTP-2. The sensing electrodes TE1 and TE2, the sensing lines TL1, TL2, and TL3, the sensing pads PDT, the ground line GNL, the ground pads GNP-1 and GNP-2, the alignment keys ALK-1 and ALK-2, and the test pads DTP-1 and DTP-2 may form the sensing circuit layer ML-T of FIG. 3.

The plurality of sensing electrodes TE1 and TE2 may include a first sensing electrode TE1 and a second sensing electrode TE2. The first sensing electrode TE1 and the second sensing electrode TE2 may be disposed in the active area AA-I. The input sensor ISP may obtain information relating to the external input based on a variation in capacitance between the first sensing electrode TE1 and the second sensing electrode TE2.

The first sensing electrode TE1 may include a plurality of first portions SP1 and a plurality of second portions BP1. The first sensing electrode TE1 may extend in the first direction DR1 and may be arranged in the second direction DR2. At least one second portion BP1 may be connected to two first portions SP1 adjacent to each other. The first portion SP1 may be referred to as a first sensing pattern. The second portion BP1 may be referred to as a first connection pattern.

The second sensing electrode TE2 may include a plurality of sensing patterns SP2 and a plurality of bridge patterns BP2. The second sensing electrode TE2 may extend in the second direction DR2 and may be arranged in the first direction DR1. At least one bridge pattern BP2 may be connected to two sensing patterns SP2 adjacent to each other. The sensing pattern SP2 may be referred to as a second sensing pattern. The bridge pattern BP2 may be referred to as a second connection pattern.

The plurality of bridge patterns BP2 may be disposed on the second base layer CBL. A first insulating layer IS-IL1 may be disposed on the second base layer CBL and the plurality of bridge patterns BP2. The plurality of first portions SP1, the plurality of sensing patterns SP2, and the plurality of second portions BP1 may be disposed on the first insulating layer IS-IL1. The plurality of first portions SP1 and the plurality of sensing patterns SP2 according to an exemplary embodiment may be disposed on the same layer. The plurality of first portions SP1 may be electrically connected to the plurality of second portions BP1. At least one opening may be defined by the first insulating layer IS-IL1. The plurality of sensing patterns SP2 may be electrically connected to the plurality of bridge patterns BP2 through the opening. A second insulating layer IS-IL2 may be disposed on the plurality of first portions SP1, the plurality of sensing patterns SP2, and the plurality of second portions BP1.

The sensing lines TL1, TL2, and TL3 may be disposed in the peripheral area NAA-I. The sensing lines TL1, TL2, and TL3 may include a first sensing line TL1, a second sensing line TL2, and a third sensing line TL3.

The first sensing line TL1 may be connected to the first sensing electrode TE1. The second sensing line TL2 may be connected to one end of the second sensing electrode TE2. The third sensing line TL3 may be connected to the other end of the second sensing electrode TE2. The other end of the second sensing electrode TE2 connected to the third sensing line T3 may be opposite to the one end of the second sensing electrode TE2 connected to the second sensing line TL2.

According to the illustrated exemplary embodiments, the second sensing electrode TE2 may be connected to the second sensing line TL2 and the third sensing line TL3. Accordingly, it is possible to maintain substantially uniform sensitivity with respect to the areas of the second sensing electrode TE2 that have a relatively longer length than that of the first sensing electrode TE1. However, exemplary embodiments are not limited thereto. For example, the third sensing line TL3 may be omitted.

The sensing pads PDT may be disposed in the peripheral area NAA-I. The sensing pads PDT may be disposed at an upper end of the input sensor ISP when viewed in plan. The sensing pads PDT may include a first sensing pad TP1, a second sensing pad TP2, and a third sensing pad TP3. The first sensing pad TP1 may be connected to the first sensing line TL1 and may be electrically connected to the first sensing electrode TE1. The second sensing pad TP2 may be connected to the second sensing line TL2, and the third sensing pad TP3 may be connected to the third sensing line TL3. Therefore, the second sensing pad TP2 and the third sensing pad TP3 may be electrically connected to the second sensing electrode TE2.

The ground line GNL may be disposed in the peripheral area NAA-I. The ground line GNL may surround the active area AA-I. For example, the ground line GNL may surround the first and second sensing electrodes TE1 and TE2 and the first, second, and third sensing lines TL1, TL2, and TL3. The ground line GNL may discharge electric charges introduced from the outside through the ground pads GNP-1 and GNP-2.

The ground pads GNP-1 and GNP-2 may be disposed in the peripheral area NAA-I. The ground pads GNP-1 and GNP-2 may be spaced apart in the first direction DR1 from the sensing pads PDT disposed at an outermost position, respectively. The ground pads GNP-1 and GNP-2 may include a first ground pad GNP-1 and a second ground pad GNP-2. The ground pads GNP-1 and GNP-2 may be electrically connected to the ground line GNL. For example, the first ground pad GNP-1 may be electrically connected to one end of the ground line GNL, and the second ground pad GNP-2 may be electrically connected to the other end of the ground line GNL. The ground pads GNP-1 and GNP-2 may be electrically connected to a ground power source of the second circuit film CF2 of FIG. 2. The ground pads GNP-1 and GNP-2 may receive a ground voltage from the ground power source.

The alignment keys ALK-1 and ALK-2 may be disposed in the peripheral area NAA-I. The second circuit film CF2 and the input sensor ISP may be aligned using the alignment keys ALK-1 and ALK-2. The alignment keys ALK-1 and ALK-2 may be electrically connected to the ground pads GNP-1 and GNP-2, respectively. The alignment keys ALK-1 and ALK-2 may be formed from the same material and in the same process as the ground pads GNP-1 and GNP-2.

According to the illustrated exemplary embodiments, each of the alignment keys ALK-1 and ALK-2 may be electrically connected to the ground power source. The electric charges introduced into the alignment keys ALK-1 and ALK-2 may be discharged through the ground pads GNP-1 and GNP-2. The electric charges may be prevented from being accumulated on the alignment keys ALK-1 and ALK-2 by discharging the electric charges through the ground pads GNP-1 and GNP-2. Therefore, the sensing lines TL1, TL2, and TL3 may be prevented from being damaged due to the electric charges that are discharged after being accumulated on each of the alignment keys ALK-1 and ALK-2 and then introduced into the sensing lines TL1, TL2, and TL3. Thus, the reliability of the display device DD may be improved.

The test pads DTP-1 and DTP-2 may be disposed in the peripheral area NAA-I. The test pads DTP-1 and DTP-2 may be spaced apart from the sensing pads PDT in the first direction DR1. The test pads DTP-1 and DTP-2 may be disposed between the ground pads GNP-1 and GNP-2 and the sensing pads PDT. The test pads DTP-1 and DTP-2 may be used to test whether the second circuit film CF2 of FIG. 2 and the sensing pads PDT are bonded to each other. The test pads DTP-1 and DTP-2 may include a first test pad DTP-1 and a second test pad DTP-2. The first test pad DTP-1 and the second test pad DTP-2 may be electrically connected to each other.

Figure 8:
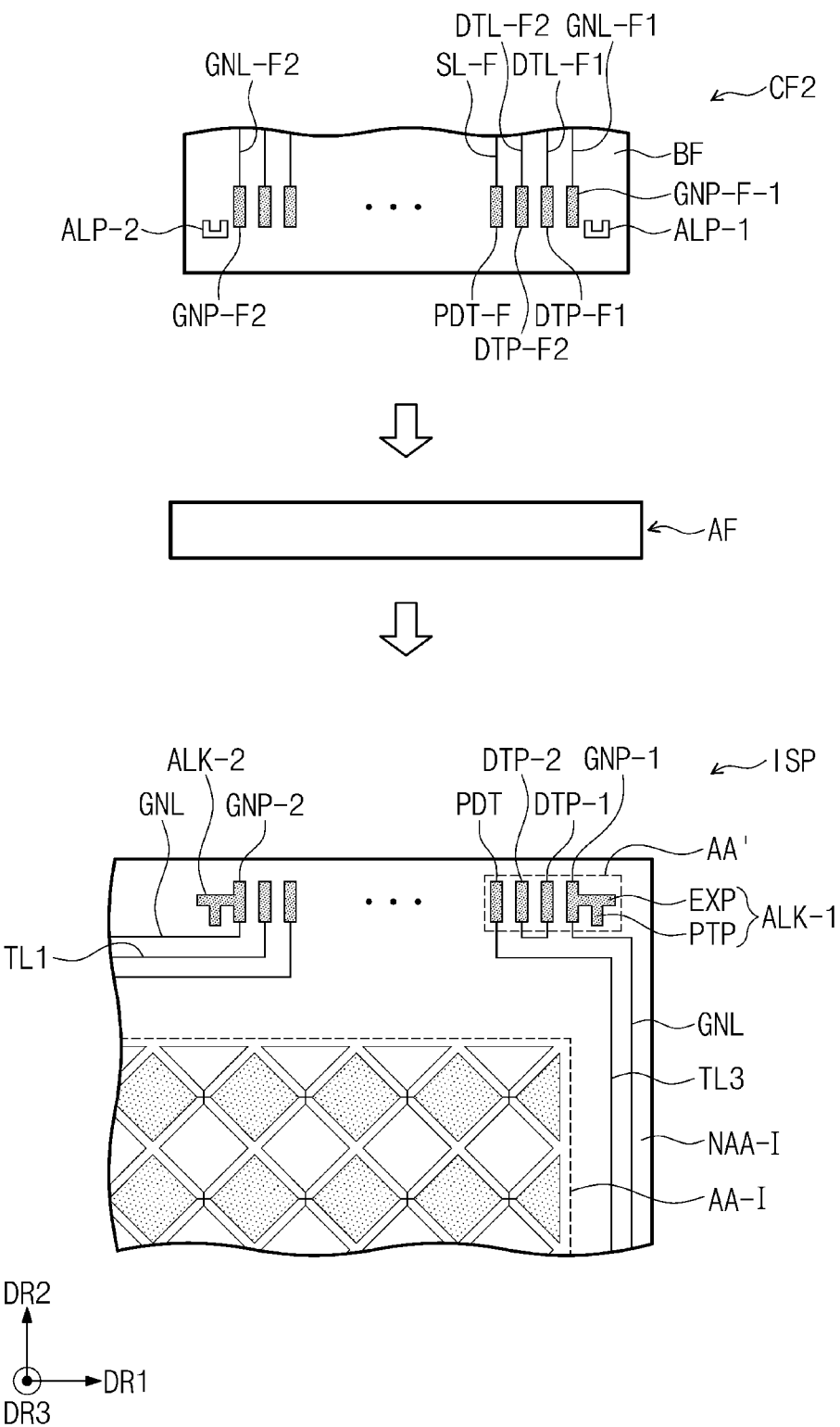
FIG. 8 is an exploded plan view of the input sensor and a second circuit film of FIG. 2.
Figure 9:
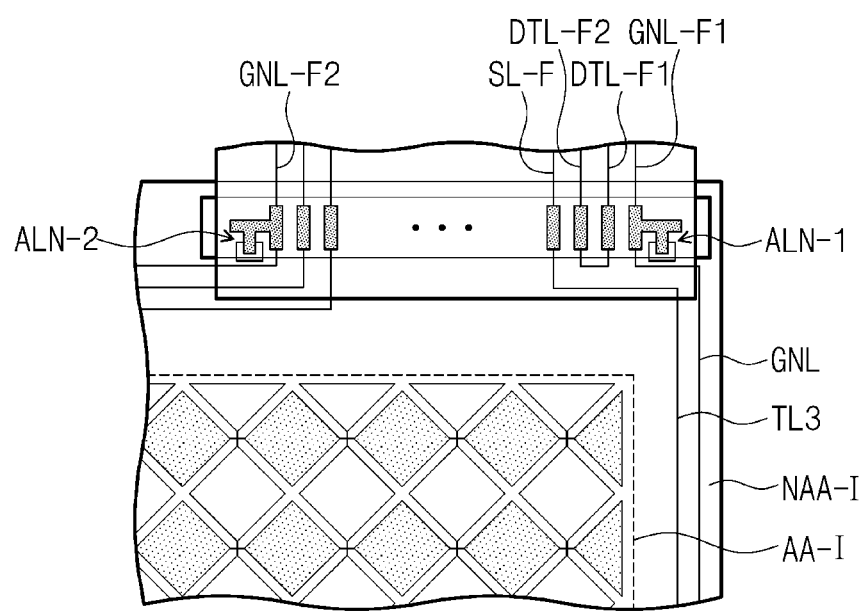
FIG. 9 is a plan view of the input sensor and the second circuit film of FIG. 2.

FIG. 8 is an exploded plan view of the input sensor of FIG. 2 and a second circuit film of FIG. 2, and FIG. 9 is a plan view of the input sensor of FIG. 2 and the second circuit film of FIG. 2.

Referring to FIGS. 8 and 9, the sensing pads PDT, the test pads DTP-1 and DTP-2, and the ground pads GNP-1 and GNP-2 may be arranged in the first direction DR1. The sensing pads PDT and the test pads DTP-1 and DTP-2 may be arranged between the first ground pad GNP-1 and the second ground pad GNP-2. The test pads DTP-1 and DTP-2 may be arranged between the sensing pads PDT and the second ground pad GNP-2.

Each of the alignment keys ALK-1 and ALK-2 may include an extension portion EXP and a protrusion portion PTP. The extension portion EXP may extend in the first direction DR1. The extension portion EXP may extend in a direction away from the sensing pads PDT. The protrusion portion PTP may protrude from the extension portion EXP in the second direction DR2 or a direction opposite to the second direction DR2. For example, the protrusion portion PTP may protrude from the extension portion EXP in a direction intersecting the first direction DR1. The protrusion portion PTP may face at least one of the sensing lines TL1, TL2, and TL3. The alignment keys ALK-1 and ALK-2 may include a first alignment key ALK-1 and a second alignment key ALK-2.

According to the illustrated exemplary embodiments, the alignment keys ALK-1 and ALK-2 may be electrically connected to the ground pads GNP-1 and GNP-2, respectively. Electric charges introduced into the alignment keys ALK-1 and ALK-2 may be discharged through the ground pads GNP-1 and GNP-2. The electric charges may be prevented from being accumulated on the alignment keys ALK-1 and ALK-2. Therefore, the sensing lines TL1, TL2, and TL3 may be prevented from being damaged due to the electric charges that are discharged after being accumulated on the alignment keys ALK-1 and ALK-2 and then introduced into the sensing lines TL1, TL2, and TL3 through the protrusion portion PTP. Thus, the reliability of the display device DD may be improved.

The alignment keys ALK-1 and ALK-2 may be provided integrally with the ground pads GNP-1 and GNP-2, respectively. The first alignment key ALK-1 may be integrally formed with the first ground pad GNP-1. The second alignment key ALK-2 may be integrally formed with the second ground pad GNP-2.

According to the illustrated exemplary embodiments, since separate lines are not necessary to connect the alignment keys ALK-1 and ALK-2 to the ground pads GNP-1 and GNP-2, the process time for manufacturing may be shortened. In addition, the electric charges introduced into the alignment keys ALK-1 and ALK-2 may be discharged through the ground pads GNP-1 and GNP-2. The alignment keys ALK-1 and ALK-2 may be connected directly to the ground pads GNP-1 and GNP-2 that receive the ground voltage. Accordingly, the electric charges introduced into the alignment keys ALK-1 and ALK-2 may be easily discharged through the ground pads GNP-1 and GNP-2. The electric charges may be prevented from being accumulated on the alignment keys ALK-1 and ALK-2. Therefore, the sensing lines TL1, TL2, and TL3 may be prevented from being damaged due to the electric charges that are discharged after being accumulated on the alignment keys ALK-1 and ALK-2 and then introduced into the sensing lines TL1, TL2, and TL3 through the protrusion portion PTP. Thus, the reliability of the display device DD may be improved.

A conductive adhesive member AF may be disposed between the second circuit film CF2 and the input sensor ISP. The conductive adhesive member AF may couple the second circuit film CF2 to the input sensor ISP. The conductive adhesive member AF may be disposed on the sensing pads PDT, the test pads DTP-1 and DTP-2, and the ground pads GNP-1 and GNP-2.

When viewed in plan, the conductive adhesive member AF may overlap the peripheral area NAA-I. The conductive adhesive member AF may extend in the first direction DR1. The conductive adhesive member AF may have a conductive property and an adhesive property. Accordingly, the conductive adhesive member AF may physically and electrically couple the second circuit film CF2 to the input sensor ISP. The conductive adhesive member AF may include an anisotropic conductive adhesive film (ACF).

The second circuit film CF2 may include a base film BF, a plurality of sensing pads PDT-F, a plurality of sensing lines SL-F, a plurality of test pads DTP-F1 and DTP-F2, a plurality of test lines DTL-F1 and DTL-F2, a plurality of ground pads GNP-F1 and GNP-F2, a plurality of ground lines GNL-F1 and GNL-F2, and a plurality of second alignment members such as alignment patterns ALP-1 and ALP-2.

The base film BF may have a flexible property and an insulating property. Therefore, the second circuit film CF2 may be bent together with the input sensor ISP after being coupled to the input sensor ISP.

The sensing pads PDT-F, the sensing lines SL-F, the test pads DTP-F1 and DTP-F2, the test lines DTL-F1 and DTL-F2, the ground pads GNP-F1 and GNP-F2, the ground lines GNL-F1 and GNL-F2, and the alignment patterns ALP-1 and ALP-2 may be disposed on the base film BF.

The sensing pads PDT-F may be respectively connected to one ends of the sensing lines SL-F. The other end of each of the sensing lines SL-F may be electrically connected to the controller 310 of FIG. 2. Thus, the electrical signals processed by the controller 310 may be output to the sensing pads PDT-F through the sensing lines SL-F. Each of the sensing pads PDT-F may be referred to as a film sensing pad.

When viewed in plan, the sensing pads PDT-F may respectively overlap the sensing pads PDT of the input sensor ISP. The sensing pads PDT-F may be respectively connected to the sensing pads PDT of the input sensor ISP.

The test pads DTP-F1 and DTP-F2 may include a first test pad DTP-F1 and a second test pad DTP-F2. The test lines DTL-F1 and DTL-F2 may include a first test line DTL-F1 and a second test line DTL-F2. The first test pad DTP-F1 may be connected to one end of the first test line DTL-F1. The second test pad DTP-F2 may be connected to one end of the second test line DTL-F2.

When viewed in plan, the first test pad DTP-F1 may overlap the first test pad DTP-1 of the input sensor ISP. The first test pad DTP-F1 may be connected to the first test pad DTP-1 of the input sensor ISP. When viewed in plan, the second test pad DTP-F2 may overlap the second test pad DTP-2 of the input sensor ISP. The second test pad DTP-F2 may be connected to the second test pad DTP-2 of the input sensor ISP.

The defect in the coupling between the second circuit film CF2 and the input sensor ISP may be tested by calculating the resistance value between the second circuit film CF2 and the input sensor ISP through a voltage provided through the test lines DTL-F1 and DTL-F2.

The ground pads GNP-F1 and GNP-F2 may include a first ground pad GNP-F1 and a second ground pad GNP-F2. The ground lines GNL-F1 and GNL-F2 may include a first ground line GNL-F1 and a second ground line GNL-F2. The first ground pad GNP-F1 may be connected to one end of the first ground line GNL-F1. The other end of the first ground line GNL-F1 may be connected to the ground power source. The second ground pad GNP-F2 may be connected to one end of the second ground line GNL-F2. The other end of the second ground line GNL-F2 may be connected to the ground power source. The ground power source may transmit the ground voltage, but exemplary embodiments are not limited thereto. Each of the ground lines GNL-F1 and GNL-F2 according to an exemplary embodiment may be connected to different ground power sources.

When viewed in plan, the first ground pad GNP-F1 may overlap the first ground pad GNP-1 of the input sensor ISP. The first ground pad GNP-F1 may be connected to the first ground pad GNP-1 of the input sensor ISP. When viewed in plan, the second ground pad GNP-F2 may overlap the second ground pad GNP-2 of the input sensor ISP. The second ground pad GNP-F2 may be connected to the second ground pad GNP-2 of the input sensor ISP.

The alignment patterns ALP-1 and ALP-2 may include a first alignment pattern ALP-1 and a second alignment pattern ALP-2. The first alignment pattern ALP-1 may be spaced apart from the first ground pad GNP-F1 in the first direction DR1. The second alignment pattern ALP-2 may be spaced apart from the second ground pad GNP-F2 in the first direction DR1. In an exemplary embodiment, each of the first alignment pattern ALP-1 and the second alignment pattern ALP-2 may define a recessed portion to facilitate alignment as discussed below.

When viewed in plan, the first alignment pattern ALP-1 may be aligned with the first alignment key ALK-1. When viewed in plan, the first alignment pattern ALP-1 and the first alignment key ALK-1 may be aligned with each other to form a first alignment mark ALN-1. When viewed in plan, the second alignment pattern ALP-2 may be aligned with the second alignment key ALK-2. When viewed in plan, the second alignment pattern ALP-2 and the second alignment key ALK-2 may be aligned with each other to form a second alignment mark ALN-2 (FIG. 9). For example, the protrusion portion PTP of each of the first and second alignment keys ALK-1 and ALK-2 may be properly aligned when visually seen as being inserted into the recess portion of the first and second alignment patterns ALP-1 and ALP-2, respectively, when viewed in plan.

Reliability in electrical connection between the second circuit film CF2 and the input sensor ISP may be improved through the first alignment mark ALN-1 and the second alignment mark ALN-2.

Figure 10:
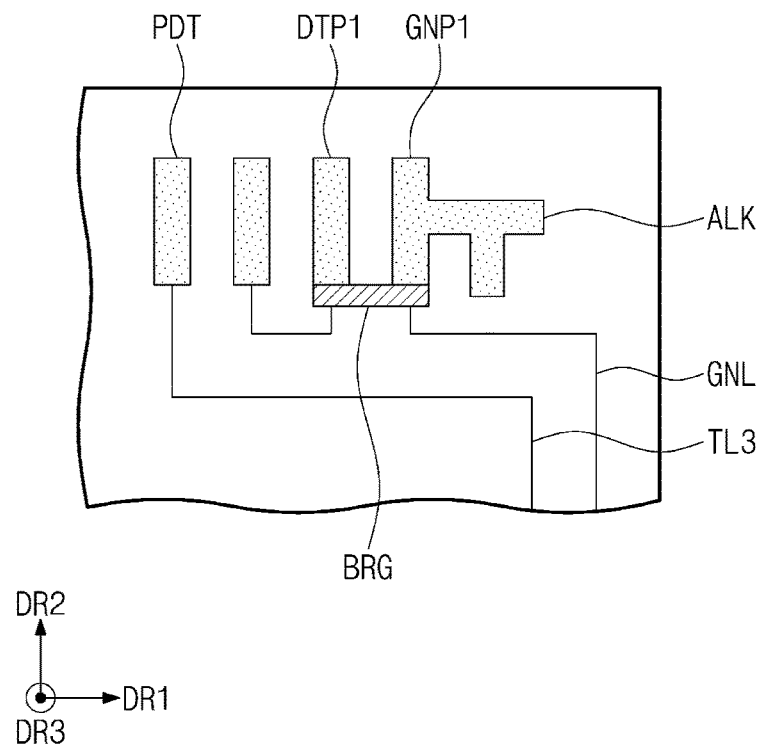
FIG. 10 is a plan view of another exemplary embodiment of the input sensor of FIG. 2 illustrating an area AA' of FIG. 8.

FIG. 10 is a plan view of another exemplary embodiment of the input sensor of FIG. 2 illustrating an area AA' of FIG. 8. In FIG. 10, the same reference numerals denote the same elements in FIG. 8 for descriptive convenience, and thus, detailed descriptions of the same elements will be omitted to avoid redundancy.

Referring to FIG. 10, a connector such as a bridge BRG may be disposed between a test pad DTP1 and a ground pad GNP1. The bridge BRG may extend in the first direction DR1. The bridge BRG may electrically connect the test pad DTP1 and the ground pad GNP1.

According to the illustrated exemplary embodiments, the electric charges introduced into the test pad DTP1 and an alignment key ALK may be discharged through the ground pad GNP1. The electric charges may be prevented from being accumulated on the test pad DTP1 and the alignment key ALK. Therefore, the sensing lines TL1, TL2, and TL3 of FIG. 8 may be prevented from being damaged due to the electric charges that are discharged after being accumulated on the test pad DTP1 and the alignment key ALK and then introduced into the sensing lines TL1, TL2, and TL3. Thus, the reliability of the display device DD may be improved.

Figure 11:
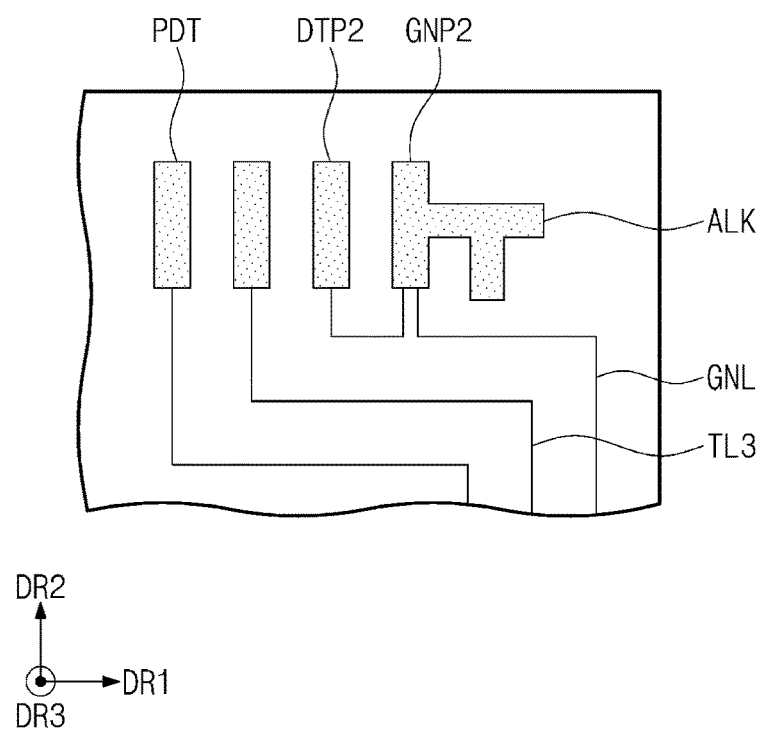
FIG. 11 is a plan view of another exemplary embodiment of the input sensor of FIG. 2 illustrating the area AA' of FIG. 8.

FIG. 11 is a plan view of another exemplary embodiment of the input sensor of FIG. 2 illustrating an area AA' of FIG. 8. In FIG. 11, the same reference numerals denote the same elements in FIG. 8 for descriptive convenience, and thus, detailed descriptions of the same elements will be omitted to avoid redundancy.

Referring to FIG. 11, a test pad DTP2 may be provided in a single form. Since the test pad DTP2 is provided in a single form, the area in which sensing pads PDT, the test pad DTP2, and a ground pad GNP2 are disposed may be reduced. The test pad DTP2 may be electrically connected to the ground pad GNP2. The test pad DTP2 may be electrically connected to the second test line DTL-F2 of FIG. 8 of the second circuit film CF2 of FIG. 8. The ground pad GNP2 may be electrically connected to the first test line DTL-F1 of FIG. 8 and the first ground line GNL-F1 of FIG. 8 of the second circuit film CF2 of FIG. 8. The defect in the coupling between the second circuit film CF2 and the input sensor ISP of FIG. 8 may be inspected by calculating a resistance value between the second circuit film CF2 of FIG. 8 and the input sensor ISP of FIG. 8 through the test pad DTP2 and the ground pad GNP2.

According to the illustrated exemplary embodiments, the electric charges introduced into the alignment key ALK may be discharged through the ground pad GNP2. The electric charges may be prevented from being accumulated on the alignment key ALK. Therefore, the sensing lines TL1, TL2, and TL3 of FIG. 8 may be prevented from being damaged due to the electric charges that are discharged after being accumulated on the alignment key ALK and then introduced into the sensing lines TL1, TL2, and TL3. Thus, the reliability of the display device DD may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel; and
   an input sensor disposed on the display panel and having an active area and a peripheral area adjacent to the active area, the input sensor comprising:
   a sensing electrode disposed in the active area;
   a sensing line disposed in the peripheral area and electrically connected to the sensing electrode;
   a sensing pad disposed in the peripheral area and electrically connected to the sensing line;
   a ground pad disposed in the peripheral area and to receive a ground voltage;
   a first alignment member disposed in the peripheral area and electrically connected to the ground pad, the first alignment member comprising a first portion extending from a middle portion of a long side of the ground pad in a first direction and a second portion extending from a middle portion of a long side of the first portion of the first alignment member in a second direction intersecting the first direction; and
   a circuit film disposed on the input sensor, the circuit film comprising a second alignment member aligned with the second portion of the first alignment member by surrounding an end of the second portion of the first alignment member.

2. The display device of claim 1, wherein the input sensor further comprises a test pad disposed in the peripheral area and spaced apart from the sensing pad.

3. The display device of claim 2, wherein the test pad is disposed between the ground pad and the sensing pad.

4. The display device of claim 2, wherein:
   the test pad comprises a plurality of test pads, and
   the input sensor further comprises a test line connected to the plurality of test pads.

5. The display device of claim 2, wherein the test pad is electrically connected to the ground pad.

6. The display device of claim 1, wherein the input sensor further comprises a ground line disposed in the peripheral area and electrically connected to the ground pad.

7. The display device of claim 6, wherein the ground line surrounds the active area.

8. The display device of claim 1, wherein the first alignment member comprises an alignment key integrated with the ground pad.

9. The display device of claim 1, wherein:
the first alignment member is a first alignment key,
the first portion of the first alignment member is an extension portion,
the second portion of the first alignment member is a protrusion portion, and
the protrusion portion faces the ground pad in the first direction and is spaced apart from the ground pad in the first direction.

10. The display device of claim 9, wherein a short side of the extension portion is directly connected to the long side of the ground pad.

11. The display device of claim 9, wherein:
the extension portion extends in a direction away from the sensing pad, and
the ground pad is disposed between the sensing pad and the extension portion in the first direction.

12. The display device of claim 1, wherein:
the display panel comprises a display pad disposed at a lower end of the display panel when viewed in plan, and
the sensing pad is disposed at an upper end of the input sensor when viewed in plan.

13. The display device of claim 1, further comprising:
a conductive adhesive member disposed between the circuit film and the input sensor.

14. The display device of claim 13, wherein the circuit film comprises:
a base film; and
a film sensing pad disposed on the base film and overlapping the sensing pad, wherein the second alignment member is disposed on the base film.

15. The display device of claim 1, wherein the first alignment member comprises substantially the same material as the ground pad.

* * * * *